United States Patent
Park et al.

(10) Patent No.: US 8,133,756 B2
(45) Date of Patent: Mar. 13, 2012

(54) CHEMICAL-MECHANICAL POLISHING METHOD FOR POLISHING PHASE-CHANGE MATERIAL AND METHOD OF FABRICATING PHASE-CHANGE MEMORY DEVICE USING THE SAME

(75) Inventors: Joon-sang Park, Seoul (KR); Chung-ki Min, Yongin-si (KR); Dong-keun Kim, Hwaseong-si (KR); Yeol Jon, Yongin-si (KR); Chang-sun Hwang, Daejeon (KR); Tae-eun Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 212 days.

(21) Appl. No.: 12/591,006

(22) Filed: Nov. 4, 2009

(65) Prior Publication Data

US 2010/0227435 A1  Sep. 9, 2010

(30) Foreign Application Priority Data

Mar. 9, 2009 (KR) .................. 10-2009-0019846

(51) Int. Cl.
*H01L 21/00* (2006.01)
(52) U.S. Cl. ........................... 438/102; 438/692

(58) Field of Classification Search .......... 438/102–103, 438/690–693
See application file for complete search history.

(56) References Cited

U.S. PATENT DOCUMENTS

| | | | | | |
|---|---|---|---|---|---|
| 5,775,980 | A | * | 7/1998 | Sasaki et al. | 451/285 |
| 6,000,997 | A | * | 12/1999 | Kao et al. | 451/7 |
| 2007/0020799 | A1 | * | 1/2007 | Choi et al. | 438/103 |
| 2007/0054475 | A1 | | 3/2007 | Lee et al. | |
| 2009/0291624 | A1 | * | 11/2009 | Katsuoka et al. | 451/288 |

FOREIGN PATENT DOCUMENTS

| | | |
|---|---|---|
| KR | 10-2007-0013034 A | 1/2007 |
| KR | 10-2007-0025612 A | 3/2007 |
| KR | 10-2008-0028544 A | 4/2008 |

* cited by examiner

*Primary Examiner* — Richard A. Booth
(74) *Attorney, Agent, or Firm* — Lee & Morse, P.C.

(57) ABSTRACT

A chemical-mechanical polishing (CMP) method of polishing a phase-change material and a method of fabricating a phase-change memory, the CMP method including forming the phase-change material on an activation surface of a semiconductor wafer, and performing a CMP process on the phase-change material using a polishing pad, wherein the performing the CMP process includes reducing a change in the composition of the phase-change material by adjusting, within a predetermined range, a temperature of a region where the semiconductor wafer and the polishing pad contact each other.

18 Claims, 11 Drawing Sheets

CHEMICAL-MECHANICAL POLISHING METHOD FOR POLISHING PHASE-CHANGE MATERIAL AND METHOD OF FABRICATING PHASE-CHANGE MEMORY DEVICE USING THE SAME

BACKGROUND

1. Field

Embodiments relate to a chemical-mechanical polishing (CMP) method for polishing a phase-change material and a method of fabricating a phase-change memory device using the same.

2. Description of the Related Art

Next-generation memory has been under development in order to overcome drawbacks associated with dynamic random access memory (DRAM), static random access memory (SRAM), and flash memory, and exploit the merits thereof. A phase-change random access memory (PRAM), which is an emerging memory technology, may exhibit a simple structure and high integration and thus, is regarded as a non-volatile memory that may be a substitute for NOR flash memory.

PRAM stores data by using a resistance difference in a material between a crystalline state (a lower electrical resistance) and an amorphous state (a higher electrical resistance). A phase-change material capable of a reversible change between the crystalline state and the amorphous state may be used to fabricate the PRAM.

SUMMARY

Embodiments are therefore directed to a chemical-mechanical polishing (CMP) method for polishing a phase-change material and a method of fabricating a phase-change memory device using the same, which substantially overcome one or more of the drawbacks, limitations, and/or disadvantages of the related art.

It is a feature of an embodiment to provide a CMP method of polishing a phase-change material that reduces damage or a change in the composition of the phase-change material that occurs during the CMP of the phase-change material.

At least one of the above and other features and advantages may be realized by providing a chemical-mechanical polishing (CMP) method of polishing a phase-change material including forming the phase-change material on an activation surface of a semiconductor wafer, and performing a CMP process on the phase-change material using a polishing pad, wherein performing the CMP process includes reducing a change in the composition of the phase-change material by adjusting, within a predetermined range, a temperature of a region where the semiconductor wafer and the polishing pad contact each other.

The predetermined range may be about 10° C. to about 30° C.

Performing the CMP process may include cooling and supplying slurry.

The slurry may be cooled to a temperature of about 5° C. to about 20° C.

A polishing head may fix the semiconductor wafer to the region where the semiconductor wafer and the polishing pad contact each other and the slurry may be supplied by a slurry dispenser that is disposed at a circumference of the polishing head.

The CMP process may be performed in a polishing chamber, the polishing chamber including a sheath formed of a thermal insulator and a cooling device for cooling the interior of the polishing chamber in order to adjust the temperature of the region where the semiconductor wafer and the polishing pad contact each other within the predetermined range.

The CMP process may be performed in a CMP polishing device, the CMP polishing device including a pad conditioner for discharging a cooling gas toward the polishing pad in order to adjust the temperature of the region where the semiconductor wafer and the polishing pad contact each other within the predetermined range.

The semiconductor wafer may be fixed to a polishing head, the polishing head including a heat sink that contacts a surface of the semiconductor wafer opposite to the activation surface.

The phase-change material may include at least one of germanium (Ge), antimony (Sb), tellurium (Te), indium (In), or a chalcogenide alloy containing mixtures thereof.

At least one of the above and other features and advantages may also be realized by providing a method of fabricating a phase-change memory including forming the phase-change material on an activation surface of a semiconductor wafer, performing a CMP process on the phase-change material using a polishing pad, and forming a memory device from the phase-change material, wherein the performing the CMP process includes reducing a change in the composition of the phase-change material by adjusting, within a predetermined range, a temperature of a region where the semiconductor wafer and the polishing pad contact each other.

The predetermined range may be about 10° C. to about 30° C.

The CMP process may include cooling and supplying slurry.

The slurry may be cooled to a temperature of about 5° C. to about 20° C.

A polishing head may fix the semiconductor wafer to the region where the semiconductor wafer and the polishing pad contact each other and the slurry is supplied by a slurry dispenser that is disposed at a circumference of the polishing head.

The CMP process may be performed in a polishing chamber, the polishing chamber including a sheath formed of a thermal insulator and a cooling device for cooling the interior of the polishing chamber in order to adjust the temperature of the region where the semiconductor wafer and the polishing pad contact each other within the predetermined range.

The CMP process may be performed in a CMP polishing device, the CMP polishing device including a pad conditioner for discharging a cooling gas toward the polishing pad in order to adjust the temperature of the region where the semiconductor wafer and the polishing pad contact each other within the predetermined range.

The semiconductor wafer may be fixed to a polishing head, the polishing head including a heat sink that contacts a surface of the semiconductor wafer opposite to the activation surface.

The method as claimed in claim 10, wherein the phase-change material includes at least one of germanium (Ge), antimony (Sb), tellurium (Te), indium (In), or a chalcogenide alloy containing mixtures thereof.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1A:
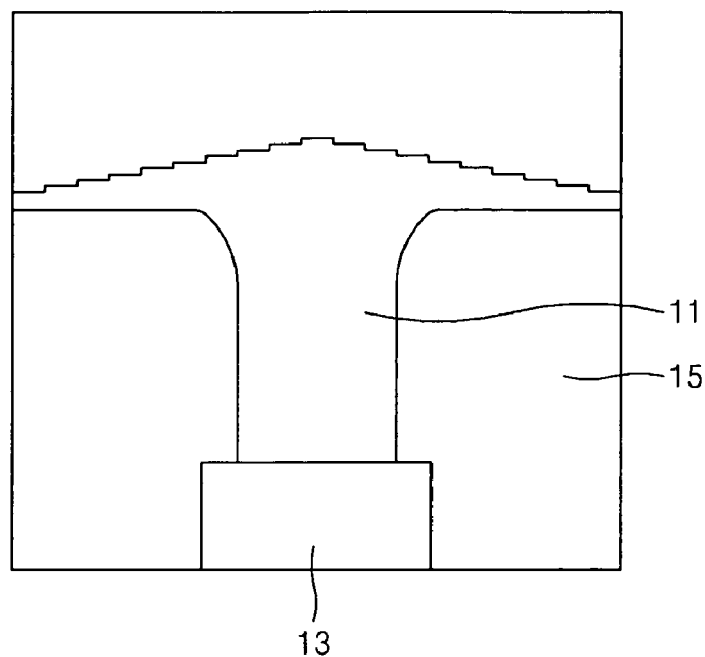
FIG. 1A illustrates a cross-sectional view of a structure in which a phase-change material is formed on a lower electrode to fill in a hole on the lower electrode.

Korean Patent Application No. 10-2009-0019846, filed on Mar. 9, 2009, in the Korean Intellectual Property Office, and entitled: "Chemical-Mechanical Polishing Method of Polishing Phase-Change Material and Method of Fabricating Phase-Change Memory Device Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

The terminology used herein is for the purpose of describing particular embodiments only and is not intended to be limiting of exemplary embodiments. As used herein, the term "and/or" includes any and all combinations of one or more of the associated listed items. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Exemplary embodiments are described herein with reference to illustrations that are schematic illustrations of embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements.

Figure 1B:
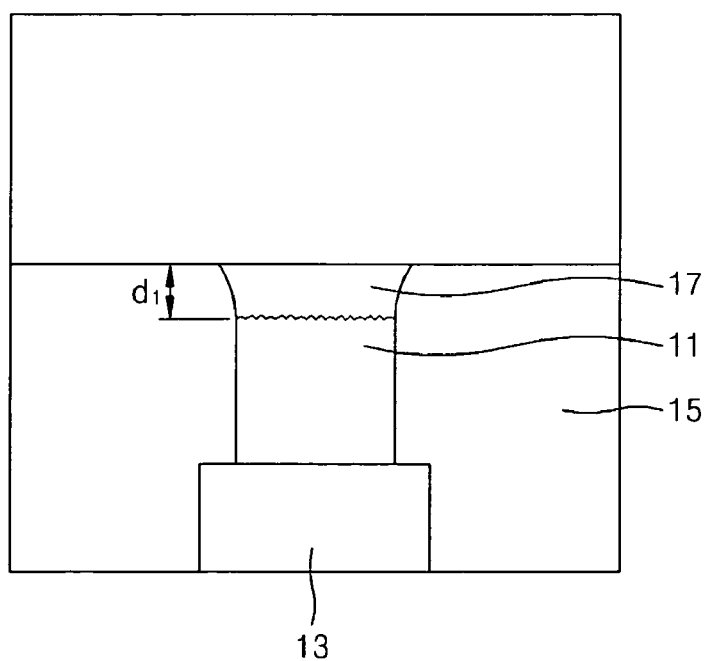
FIG. 1B illustrates a cross-sectional view of a structure in which a chemical-mechanical polishing (CMP) process is performed on a phase-change material.
Figure 1C:
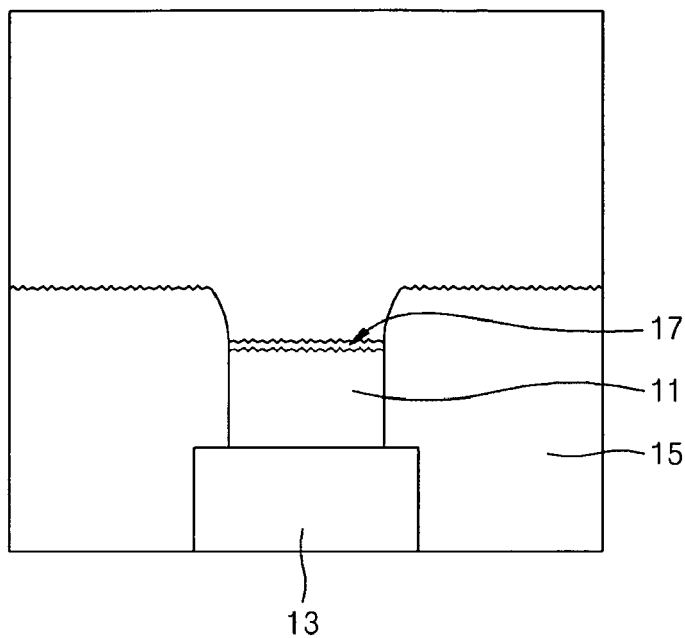
FIG. 1C illustrates a cross-sectional view of a structure in which an etching-back process is performed on a phase-change material to remove a portion of the phase-change material damaged by a CMP process.

FIGS. 1A through 1C illustrate diagrams showing stages in a method of fabricating a phase change memory device including a phase-change material 11 and a lower electrode 13. FIG. 1A illustrates a structure in which a phase-change material 11 is formed on the lower electrode 13. FIG. 1B illustrates a structure in which a chemical-mechanical polishing (CMP) process has been performed on the phase-change material 11. FIG. 1C illustrates a structure in which an etching-back process has been performed on the phase-change material 11 to remove a portion of the phase-change material 11 damaged by the CMP process. FIGS. 1A through 1C illustrate schematic diagrams for explaining the CMP process performed on the phase-change material 11.

Referring to FIG. 1A, the lower electrode 13 may be patterned using an etching mask. An insulation layer 15 may be stacked on the lower electrode 13. The insulation layer 15 may be formed by, e.g., a chemical vapor deposition (CVD) process, a plasma chemical vapor deposition (PCVD) process, an atomic layer deposition (ALD) method, or a high density plasma chemical vapor deposition (HDP-CVD) process.

A hole may be formed by etching a part of the insulation layer 15 using, e.g., a photolithography process, through which the lower electrode 13 may be exposed. The phase-change material 11 may then fill in the hole.

The phase-change material 11 may include, e.g., a combination of at least one element (e.g. Te, Po, and/or Sb) of groups 15 and 16 of the periodic table and at least one of In, Ge, Ga, Sn, and/or Ag. A germanium (Ge)-antimony (Sb)-tellurium (Te) alloy (a GST alloy) having a chemical formula of $Ge_2Sb_2Te_5$ may be useful for the phase-change material 11. Indium antimonide InSb may be also used for the phase-change material 11. The phase-change material 11, e.g., the GST alloy, may reversibly change a physical state according to a heating/cooling speed, temperature, and time. Since the phase-change material 11 may have a layered structure, the phase-change material 11 may be layered and disposed above the hole.

Referring to FIG. 1B, the phase-change material 11 disposed above the hole may be removed by performing the CMP process. The phase-change material 11 and the insulation layer 15 may be planarized by the CMP process as illustrated in FIG. 1B. However, an exposed part of the phase-change material 11 may be damaged due to the CMP process, resulting in a damaged portion 17.

The phase-change material 11, which may be relatively ductile, in particular, a chalcogenide alloy, e.g., the GST alloy, may not have a dense structure and thus the phase-change material 11 may be easily invaded by another element and oxidized. Therefore, the damaged portion 17 of the phase-change material 11 may have a different composition from the rest of the phase-change material 11. For example, before the CMP process is performed on the phase-change material 11, Ge:Sb:Te may have a composition ratio of about 25:22:52. However, after the CMP process is performed on the phase-change material 11, Ge:Sb:Te in the damaged portion 17 may have a composition ratio of about 20:27:53, about 16:29:54, or about 33:19:48. Such a change in the composition may vary according to a slurry used in the CMP process. Also, after the CMP process is performed on the phase-change material 11, the damaged portion 17 of the phase-change material 11 may contain oxygen.

A thickness d1 of the damaged portion 17 of the phase-change material 11 may be about 50 Å to about 150 Å. However, the thickness d1 may vary according to the slurry used in the CMP process.

The damaged portion 17 of the phase-change material 11 having a different composition may undesirably increase a reset current $I_{reset}$ necessary for a phase-change. Such an increase in reset current may result in an increase in power consumption used to operate a phase-change random access memory (PRAM) including the damaged portion 17 of the phase-change material 11. The PRAM requiring high power consumption may be unsuitable for use in, e.g., cellular devices requiring low power consumption.

Referring to FIG. 1C, the damaged portion 17 may be removed by performing an etching-back process. In particular, e.g., a radio frequency (RF) sputtering etching process, may be performed. However, since the phase-change material 11, e.g., GST alloy, may be ductile, the phase-change material 11 may have a considerably retracted structure compared to that of the insulation layer 15. Such a retracted structure may cause a problem in a subsequent process, and may adversely influence reliability of a finished device. In addition, the phase-change material 11 may be further damaged during the etching-back process. Furthermore, the etching-back process may be performed in addition to the CMP process, which may increase total fabricating expenses and time.

Embodiments provide a CMP process of polishing a phase-change material that may reduce damage to the phase-change material 11 without having to perform the etching-back process.

The phase-change material 11, e.g., a chalcogenide alloy including GST alloy, may be feasible in an external environment to the extent that the phase-change material 11 may be damaged to a relatively low thickness, e.g., only up to about 15 Å, in an initial deposition state. Moreover, the phase-change material 11 may be more feasible in an environment where a strong external pressure, e.g., the CMP, is applied and where mechanical friction and a chemical reaction occur. When the phase-change material 11, including, e.g., GST alloy, is exposed to slurry during the CMP process, the phase-change material 11 may be easily damaged.

CMP slurry may contain polishing particles, e.g. silica, alumina, and/or ceria, in order to mechanically polish the phase-change material 11. The slurry may further contain an oxidizing agent for oxidizing the phase-change material 11. The slurry may also contain, e.g., a chelating agent, a pH regulator, an anti-corrosive agent, and ultrapure water, etc., in order to remove metal ions.

To prevent the phase-change material 11 from being damaged, an attempt to reduce exposure of the phase-change material 11 to the slurry during the CMP process has been conducted. However, achieving a desired polishing thickness and reducing exposure may involve an increase in polishing pressure or polishing speed. The increase in polishing pressure or polishing speed may result in a large increase in frictional heat between a semiconductor wafer and a polishing pad. The increase in frictional heat may result in an increase in temperature of a region where the semiconductor wafer and the polishing pad contact each other. Such an increase in temperature may increase the damage to the phase-change material 11.

A chemical reaction rate may be linearly proportional to a reaction time and exponentially proportional to a reaction temperature. Although the reaction time may be reduced, the reaction temperature may increase due to frictional heat, which may not reduce damage to the phase-change material 11. Therefore, if the temperature of the region where the semiconductor wafer and the polishing pad contact each other is adjusted during the CMP process, the damage to the phase-change material 11 may be reduced.

Figure 2:
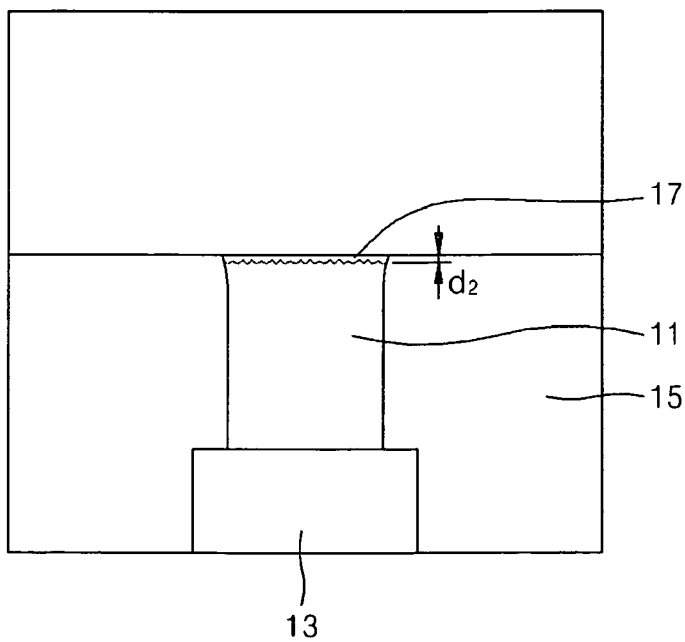
FIG. 2 illustrates a cross-sectional view of a structure in which a CMP process is completely performed on a phase-change material according to an embodiment.

FIG. 2 illustrates a structure in which the CMP process has been completely performed on the phase-change material 11 according to an embodiment. Referring to FIG. 2, the lower electrode 13 that is patterned using an etching mask (not shown) may be formed. The insulation layer 15 may be formed by using, e.g., a CVD process, a PCVD process, an ALD method, or a HDP-CVD process. A process of planarizing the insulating layer 15 may then be performed.

The hole may be formed by etching a part of the insulation layer 15 using, e.g., a photolithography process, through which the lower electrode 13 may be exposed. The phase-change material 11, e.g., a chalcogenide alloy including GST alloy, may be used to fill in the hole. Once the phase-change material 11 is deposited in the hole, an upper portion of the phase-change material 11 may be removed via the CMP process at a controlled temperature.

The CMP process may include fixing the semiconductor wafer, which may have an activation surface on which the phase-change material 11 is formed, to a polishing head, making the semiconductor wafer contact a polishing pad and slurry, relatively moving the semiconductor wafer and the polishing pad, and removing the phase-change material 11 through a chemical reaction and mechanical friction. In this regard, the temperature of the region where the semiconductor wafer and the polishing pad contact each other may be adjusted within a predetermined range, i.e., the controlled temperature. The predetermined range of temperatures may be about 10° C. to about 30° C.

As a result of performing the CMP process at the predetermined temperature range, a thickness d2 of the damaged portion 17 may be substantially smaller than the thickness d1 of the damaged portion 17 illustrated in FIG. 1B. For example, the thickness d2 may be negligible, so electronic characteristics of the PRAM may not be affected, and removal of the damaged portion 17 may not be required. Thus, the reset current $I_{reset}$ may be advantageously reduced, thereby fabricating a low power PRAM. Also, the CMP process according to embodiments may not need an etching-back process, which may reduce fabricating expenses and time, and may not cause a problem in terms of reliability due to a retracted structure.

Figure 3:
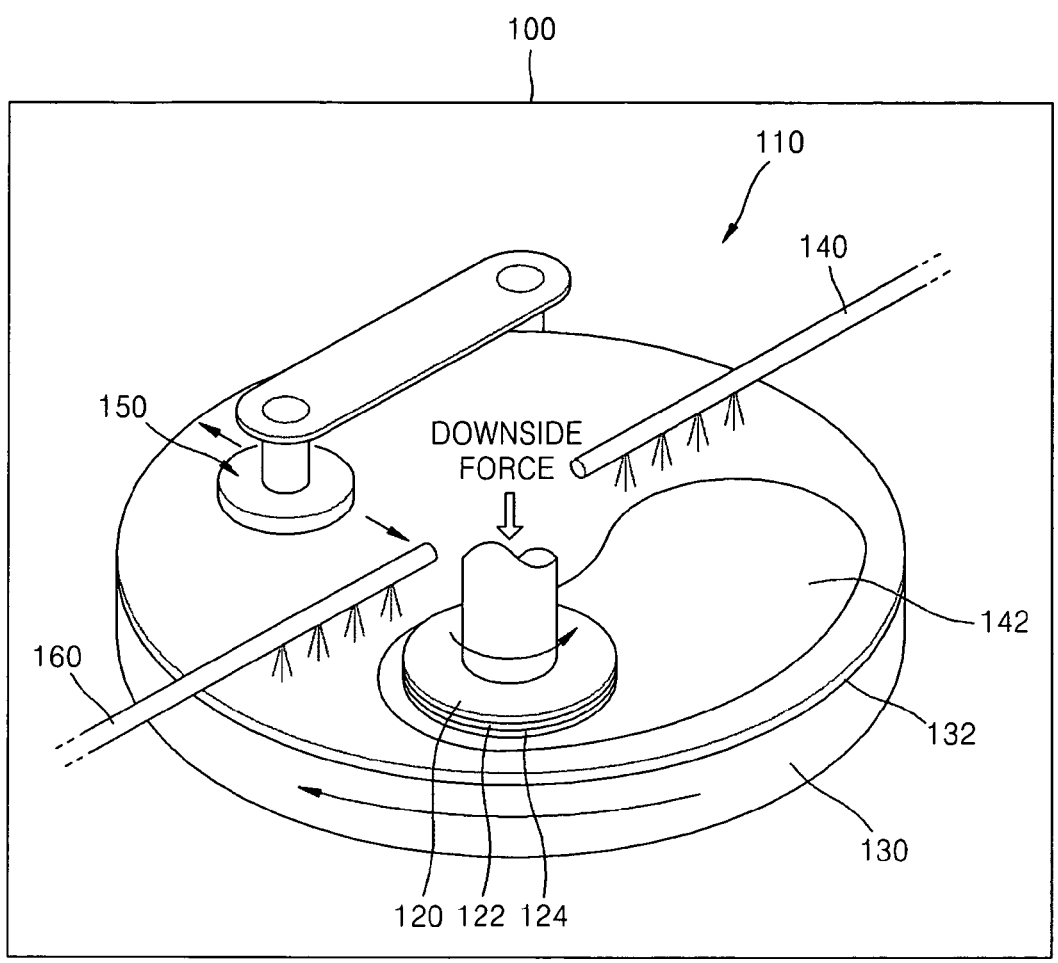
FIG. 3 illustrates a perspective view of a CMP process of polishing a semiconductor wafer by using a CMP device in a polishing chamber according to an embodiment.

A method of adjusting the temperature of the region where the semiconductor wafer and the polishing pad contact each other will now be described. FIG. 3 illustrates a diagram for explaining a CMP process of polishing a semiconductor wafer 124 using a CMP device 110 in a polishing chamber 100 according to an embodiment. Referring to FIG. 3, the CMP device 110 may be one of various polishing devices illustrated for clarity of explanation. The idea and scope is not limited to the CMP device 110 illustrated in FIG. 3.

The CMP chamber 100 may include the CMP device 110. The CMP device 110 may include a polishing head 120 that vacuums the semiconductor wafer 124 and applies a downward force toward the polishing pad 132. The polishing head 120 may rotate in a predetermined direction so as to provide a relative movement between the semiconductor wafer 124 and the polishing pad 132. In order to uniformly polish the semiconductor wafer 124, e.g., a backing film 122 or a membrane, may be disposed between the polishing head 120 and the semiconductor wafer 124. The backing film 122, which may absorb shock between the semiconductor wafer 124 and the polishing head 120, may be formed of, e.g., elastic polyurethane.

The polishing pad 132 may contact the semiconductor wafer 124 fixed to the polishing head 120 so as to polish the semiconductor wafer 124. A platen 130 may support the polishing pad 132 contacting the semiconductor wafer 124. The platen 130 may move or rotate in a predetermined direction so as to provide a relative movement to the polishing pad 132. The polishing pad 132 may be formed of, e.g., high density porous polyurethane, so as to polish the semiconductor wafer 124. Polyurethane is a representative thermal insulator.

A slurry dispenser 140 may be disposed on the platen 130 to dispense a slurry 142 to the polishing pad 132. The slurry 142 may be used to perform the CMP process by forming a film between the semiconductor wafer 124 and the polishing pad 132. The slurry 142 may contain a chemical material used to oxidize and/or decompose the phase-change material 11 and polishing particles used to mechanically remove the oxidized and/or decomposed phase-change material 11. The slurry 142 may be a liquid suspension containing slurry powder including polishing particles and a slurry liquid that dilutes the slurry powder and induces a chemical reaction. If a temperature of the slurry 142 is too low, the slurry powder containing polishing particles may condense, which may cause undesirable scratching of the semiconductor wafer 124 during polishing.

A by-product generated by polishing the semiconductor wafer 124 and the slurry 142 may be piled on the porous polishing pad 132. A contact pad conditioner 150 and/or a gas discharge pad conditioner 160 may be used to remove the by-product and the slurry 142 while the semiconductor wafer 124 is being polished. The contact pad conditioner 150 may allow a disc or blush containing, e.g., diamond particles, to contact the polishing pad 132, may generate a relative movement between the disc or blush and the polishing pad 132, and may restore surface toughness of the polishing pad 132 to a normal state. The gas discharge pad conditioner 160 may be disposed on an upper portion of the polishing pad 132, may spray high pressure gas, e.g., nitrogen, toward the polishing pad 132, and may remove the by-product and the slurry 142 piled on the porous polishing pad 132.

While the CMP device 110 performs the CMP process on the semiconductor wafer 124 through the polishing pad 132 and the slurry 142, frictional heat may be generated due to mechanical friction between the semiconductor wafer 124 and the polishing pad 132. The frictional heat may facilitate a chemical reaction between the slurry 142 and the phase-change material 11, which may increase damage on the phase-change material 11. It may be difficult for the CMP device 110 to externally dissipate the frictional heat. The backing film 122 that covers the semiconductor wafer 124 and the polishing pad 132 may be formed of polyurethane that is a representative thermal insulator. Thus, the frictional heat may be isolated between the semiconductor wafer 124 and the polishing pad 132, which may gradually increase the temperature of the region where the semiconductor wafer 124 and the polishing pad 132 contact each other.

Figure 4:
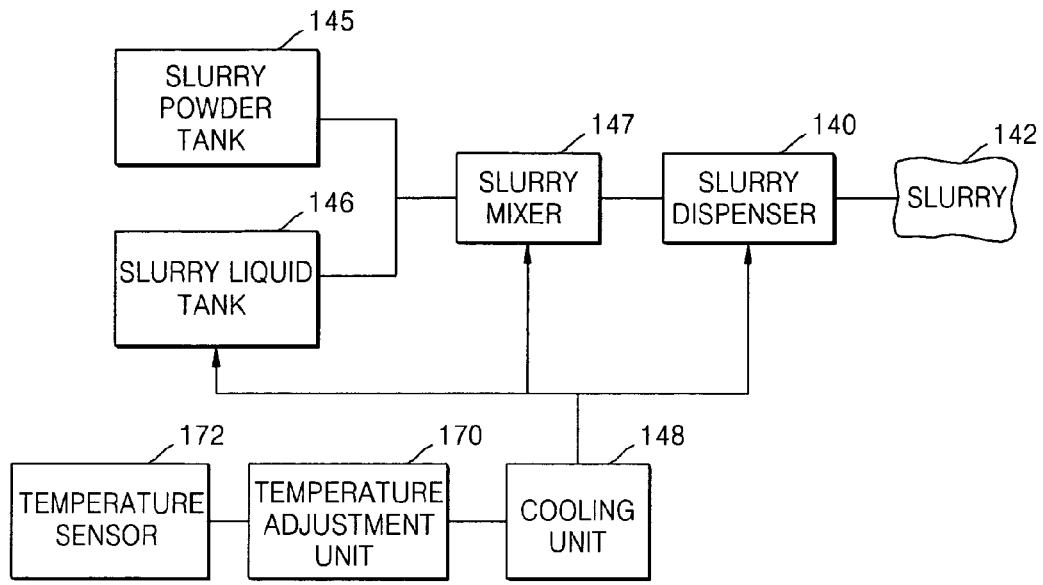
FIG. 4 illustrates a block diagram of a device for adjusting a temperature of a region where a semiconductor wafer and a polishing pad contact each other and explaining a process of supplying a slurry according to an embodiment.

FIG. 4 illustrates a block diagram of a device for adjusting the temperature of the region where the semiconductor wafer 124 and the polishing pad 132 contact each other. The block diagram may be used to explain a process of supplying the slurry 142 according to an embodiment.

Referring to FIGS. 3 and 4, the slurry 142 may be discharged through the slurry dispenser 140, and coated on the surface of the polishing pad 132 illustrated in FIG. 3. The slurry 142 may include, e.g., slurry powder and slurry liquid. The slurry powder and slurry liquid may be mixed by a slurry mixer 147; and the mixed slurry powder and slurry liquid may be provided to the slurry dispenser 140. For example, the slurry powder may be stored in a slurry powder tank 145; and the slurry liquid may be stored in a slurry liquid tank 146. Three or more slurry elements may be stored in three or more tanks before the slurry powder and slurry liquid are mixed according to the CMP process performed. The slurry powder and slurry liquid may be mixed by two or more slurry mixers according to the characteristics of the slurry elements.

In order to adjust the temperature of the region where the semiconductor wafer 124 and the polishing pad 132 contact each other, slurry 142 cooled to a predetermined temperature may be provided on the polishing pad 132. The predetermined temperature may be about 5° C. to about 20° C., e.g., about 12° C. Maintaining the temperature of the slurry 142 at about 5° C. or greater may help ensure that the slurry powder is uniformly diluted and does not condense, thereby preventing scratching of the semiconductor wafer 124.

In order to cool the slurry 142 to the predetermined temperature, a cooling unit 148 may be included in the CMP device 110. The cooling unit 148 may cool at least one of the slurry liquid tank 146, the slurry mixer 147, and the slurry dispenser 140. The slurry 142 may be cooled before or after the slurry powder and slurry liquid are mixed, according to the characteristics of the slurry 142.

For example, the cooling unit 148 may include a conduit (not shown) that surrounds at least one of the slurry liquid tank 146, the slurry mixer 147, and/or the slurry dispenser 140. The cooling unit 148 may cool at least one of the slurry liquid tank 146, the slurry mixer 147, and/or the slurry dispenser 140 by circulating a heat transfer medium, e.g., cooling water, through the conduit. In another implementation, the cooling unit 148 may include a cooler (not shown) that contacts a sheath of at least one of the slurry liquid tank 146, the slurry mixer 147, and/or the slurry dispenser 140. The cooler may use, e.g., evaporation heat in a similar manner to that of refrigerators or air conditioners. Alternatively, the cooling unit 148 may be the conduit or the cooler disposed in the sheath of at least one of the slurry liquid tank 146, the slurry mixer 147, and/or the slurry dispenser 140.

In order to adjust the temperature of the region where the slurry 142 or the semiconductor wafer 124 contact the polishing pad 132, a temperature adjustment unit 170 may control the cooling unit 148. The temperature adjustment unit 170 may receive temperature information from a temperature sensor 172 that measures the temperature of the slurry 142 or the temperature of the region where the slurry 142 or the semiconductor wafer 124 contact the polishing pad 132. For example, the temperature sensor 172 may be disposed in the slurry dispenser 140 or the polishing pad 131 and measure the temperature of the slurry 142 or the temperature of the region where the slurry 142 or the semiconductor wafer 124 contact the polishing pad 132. The temperature sensor 172 may include, e.g., an infrared detection temperature sensor (not shown), installed in the polishing chamber 100 that measures the temperature of the region where the slurry 142 or the semiconductor wafer 124 contact the polishing pad 132.

The temperature adjustment unit 170 may control the cooling unit 148 by using the temperature of the slurry 142 or the temperature of the region where the slurry 142 or the semiconductor wafer 124 contact the polishing pad 132. The cooling unit 148 may cool at least one of the slurry liquid tank 146, the slurry mixer 147, and/or the slurry dispenser 140 so that the cooled slurry 142 may be used to perform the CMP process on the phase-change material, thereby reducing damage to the phase-change material.

Figure 5:
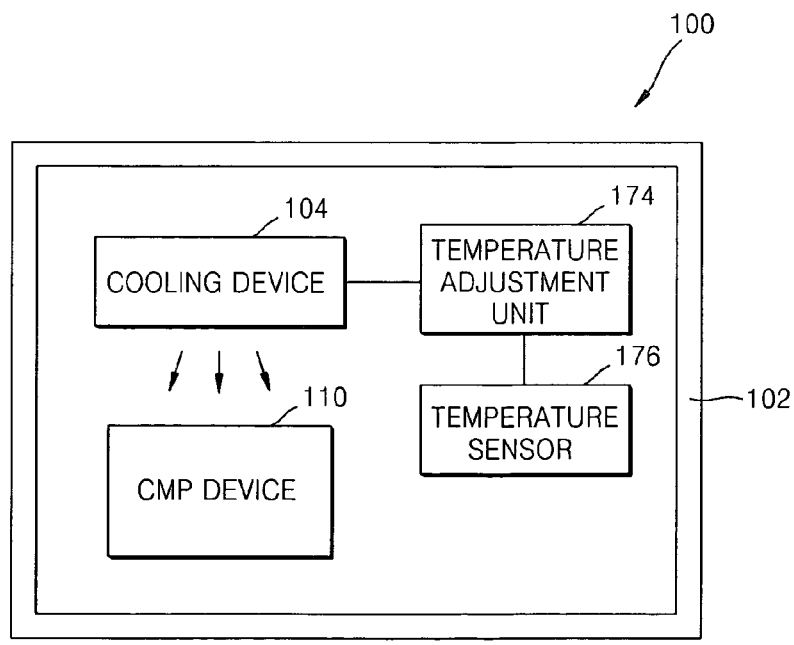
FIG. 5 illustrates a schematic block diagram of a polishing chamber including a cooling device according to another embodiment.

FIG. 5 illustrates a schematic block diagram of a polishing chamber 100 including a cooling device 104 according to another embodiment.

Referring to FIGS. 3 and 5, the polishing chamber 100 may include the cooling device 104, e.g., a cooling/freezing store or a refrigerator, controlled by a temperature adjustment unit 174 that receives the temperature from a temperature sensor 176. The polishing chamber 100 may further include a sheath 102.

The sheath 102 may be formed of a thermal insulation material, e.g., Styrofoam or polyurethane foam, having a low heat transfer coefficient in order to prevent a cooling loss between the interior and exterior of the polishing chamber 100.

The cooling device 104 may be provided to reduce the temperature of the interior of the polishing chamber 100. The cooling device 104 may include, e.g., a freezer or an air conditioner.

The temperature adjustment unit 174 may control the temperature of the interior of the polishing chamber 100 by controlling the cooling device 104. The temperature adjustment unit 174, which may be the same as the temperature adjustment unit 170 illustrated in FIG. 4, may control the cooling device 104 and the cooling unit 148 illustrated in FIG. 4. Alternatively, the temperature adjustment unit 174 may independently control the cooling device 104.

The temperature sensor 176 may be a sensor that measures the temperature of the interior of the polishing chamber 100 or the temperature of the region where the semiconductor wafer 124 and the polishing pad 132 contact each other. The temperature sensor 176, which may be the same as the temperature sensor 172 illustrated in FIG. 4, may provide the temperature adjustment unit 174 with the temperature of the region where the semiconductor wafer 124 and the polishing pad 132 contact each other. Also, the temperature sensor 176 may output the temperature of the interior of the polishing chamber 100.

The temperature of the interior of the polishing chamber 100 may be adjusted by using the sheath 102 formed of a thermal insulation material and the cooling device 104, thereby reducing the temperature of the region where the semiconductor wafer 124 and the polishing pad 132 contact each other. Thus, damage to the phase-change material may be reduced.

Figure 6A:
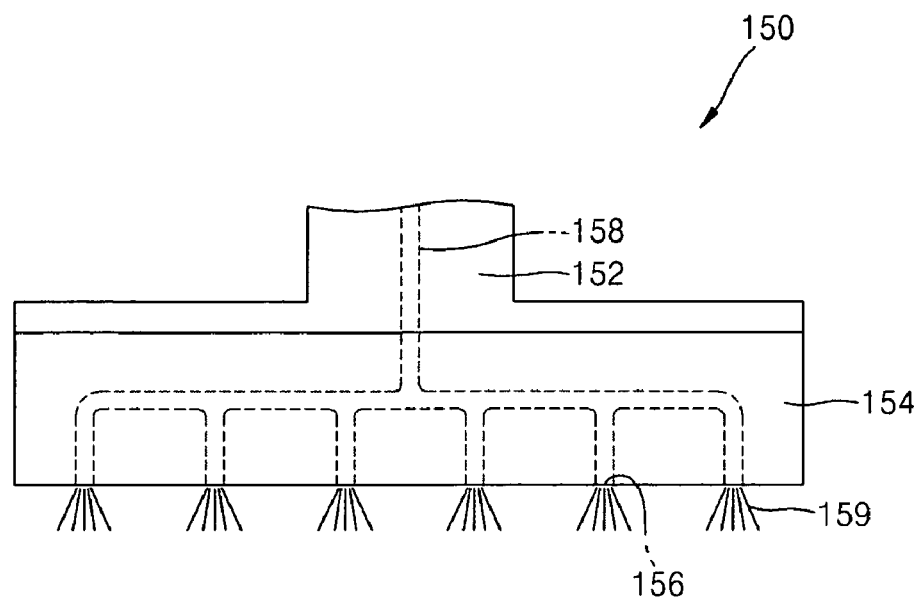
FIG. 6A illustrates a cross-sectional view of a contact pad conditioner that ejects a cooling gas according to an embodiment.
Figure 6B:
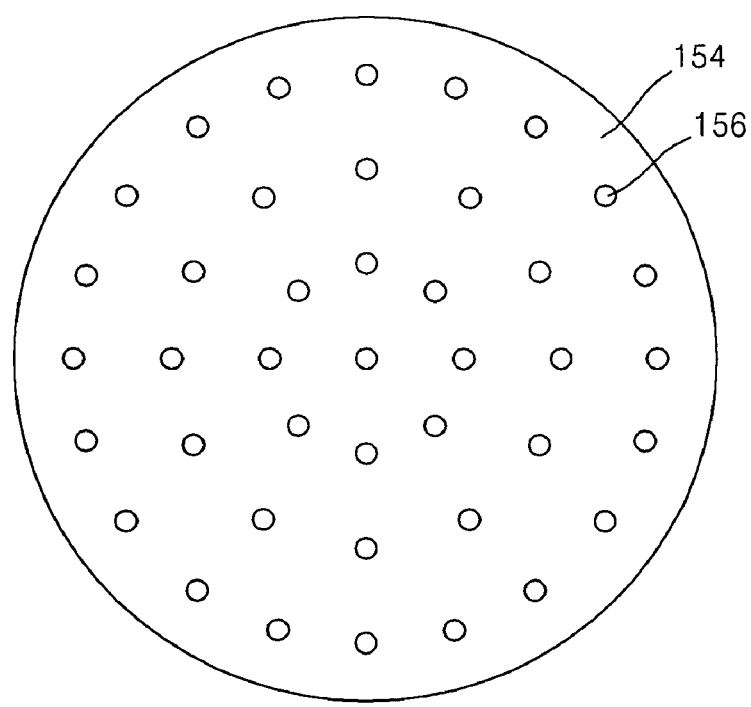
FIG. 6B illustrates a bottom view of the contact pad conditioner of FIG. 6A.

FIGS. 6A and 6B schematically illustrate the contact pad conditioner 150 that may eject a cooling gas 159 according to an embodiment. FIG. 6A illustrates a cross-sectional view of the contact pad conditioner 150. FIG. 6B illustrates a bottom view of the contact pad conditioner 150.

Referring to FIGS. 3 and 6A, the contact pad conditioner 150 may include a disc 154 that maintains surface toughness of the polishing pad 132 and a body 152 that supports the disc 154.

A cooling gas tube 158, through which the cooling gas 159 passes, may penetrate the body 152 and the disc 154. A plurality of holes 156 through which the cooling gas 159 is discharged may be disposed in a lower surface of the disc 154. The disc 154 may selectively include the holes 156 that pass through upper and lower surfaces of the disc 154. If the disc 154 is attached to the body 152, the body 152 may include the cooling gas tube 158 corresponding to the holes 156. Referring to FIG. 6B, the holes 156 may be formed in the disc 154.

The cooling gas tube 158 may be connected to a cooling gas tank (not shown) or a cooling gas supplying unit (not shown). Referring to FIGS. 4 and 5, the cooling gas tank or the cooling gas supplying unit may include a temperature adjustment unit that receives a temperature of the cooling gas 159 from a temperature sensor and adjusts the temperature of the cooling gas 159.

The cooling gas 159 may include, e.g., nitrogen gas below about 15° C. The temperature adjustment unit that controls the cooling gas tank or the cooling gas supplying unit connected to the cooling gas tube 158 may adjust the temperature of the cooling gas 159 or an amount of the ejected cooling gas 159.

The contact pad conditioner 150 may be disposed on the surface of the polishing pad 132, may be pressed toward the polishing pad 132, may relatively move, and may restore surface toughness of the polishing pad 132 to a normal state during a CMP process. Such a CMP process may generate friction, which may increase the temperature of the polishing pad 132 if not properly cooled. The polishing pad 132 may thereby have a high temperature due to, e.g., frictional heat generated by polishing the semiconductor wafer 124. The contact pad conditioner 150 of the present embodiment may discharge the cooling gas 159 toward the polishing pad 132 during a conditioning operation of the polishing pad 132, thereby reducing the temperature of the polishing pad 132. Thus, the temperature of the region where the semiconductor wafer 124 and the polishing pad 132 contact each other may be reduced, thereby reducing damage, i.e., a change in the composition of the phase-change material.

Figure 7:
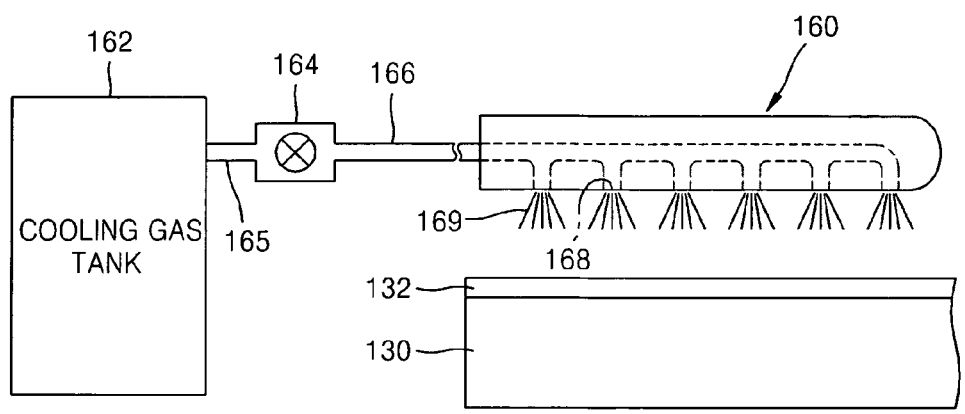
FIG. 7 illustrates a cross-sectional view of a gas discharge pad conditioner that ejects a cooling gas according to another embodiment.

FIG. 7 illustrates a cross-sectional view of the gas discharge pad conditioner 160 that ejects a cooling gas 169 according to an embodiment.

Referring to FIGS. 3 and 7, the gas discharge pad conditioner 160 may be disposed at a predetermined height above the platen 130 that supports and rotates the polishing pad 132. If not properly cooled, the polishing pad 132 may have a high temperature due to, e.g., frictional heat between the polishing pad 132 and the semiconductor wafer 124.

The gas discharge pad conditioner 160 may include a first cooling gas tube 166 and a plurality of gas ejection holes 168 disposed to face the polishing pad 132. The cooling gas tube 166 may be connected to a gas pump 164. The gas pump 164 may be connected to a cooling gas tank 162, which stores the cooling gas 169, through a second cooling gas tube 165.

Referring to FIG. 7, the cooling gas tank 162 or the gas pump 164 may be controlled by a temperature adjustment unit connected to a temperature sensor (not shown).

The cooling gas 169 may include, e.g., a nitrogen gas below about 15° C. The temperature adjustment unit that controls the cooling gas tank 162 or the gas pump 164 may adjust the temperature of the cooling gas 169 and/or the amount of ejected cooling gas 169.

The gas discharge pad conditioner 160 of the present embodiment may reduce the surface temperature of the polishing pad 132 by ejecting the cooling gas 169 toward the polishing pad 132 that rotates at a high temperature. Thus, the temperature of the region where the semiconductor wafer 124 and the polishing pad 132 contact each other may be reduced, thereby reducing damage, i.e., a change in the composition of a phase-change material.

According to the embodiments described with reference to FIGS. 5, 6A, 6B, and 7, while the CMP process is performed on the phase-change material, the polishing pad 132 may be cooled by the cooling device 104 and/or the cooling gases 159 and 169, and thus, the slurry 142 coated on the polishing pad 132 may condense. Cooling of the polishing pad 132 may reduce the temperature of a contact layer between the slurry 142 and the semiconductor wafer 124, thereby reducing damage to the phase change material.

Figure 8:
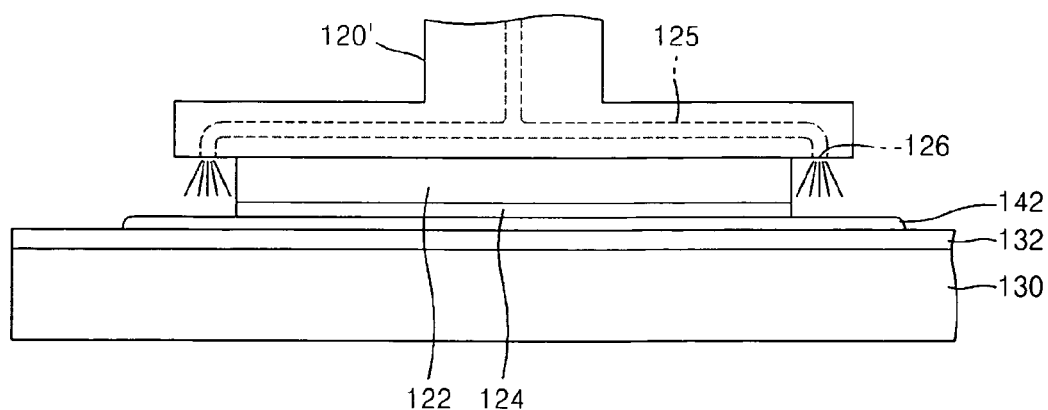
FIG. 8 illustrates a cross-sectional view of a polishing head that ejects a slurry onto a cooled polishing pad according to an embodiment.

FIG. 8 illustrates a cross-sectional view of a polishing head 120' that ejects the slurry 142 to the cooled polishing pad 132 according to an embodiment. Referring to FIG. 8, in order to perform a CMP process on the semiconductor wafer 124 having an activation surface on which a phase-change material is formed, the polishing pad 132 may be disposed on the platen 130, and the semiconductor wafer 124 may be fixed to the polishing head 120'. The polishing head 120' may further include the backing film 122 so as to improve the polishing uniformity of the semiconductor wafer 124. The slurry 142 may be disposed between the polishing pad 132 and the semiconductor wafer 124, and may be used to perform the CMP process. The polishing head 120' may be used in the CMP device illustrated in FIG.

The polishing head 120' may further include at least two ejection holes 126 used to provide the polishing pad 132 with the slurry 142 and a slurry tube 125 to supply the slurry 142 to the ejection holes 126. The slurry tube 125 may penetrate the polishing head 120', and may have an end connected to a slurry pump (not shown) or a slurry storage tank (not shown).

The ejection holes 126 used to provide the polishing pad 132 with the slurry 142 may face a boundary of the region where the semiconductor wafer 124 and the polishing pad 132 contact each other. Although the polishing pad 132 may be extremely cooled according to the methods described with reference to FIGS. 5 through 7, the boundary of the region where the semiconductor wafer 124 and the polishing pad 132 contact each other may have a relatively high temperature due to frictional heat. Thus, the ejected slurry 142 may not contact the extremely cooled polishing pad 132 and may not condense, thereby preventing scratching of the semiconductor wafer 124. Thus, the slurry 142 may not condense and the temperature of the polishing pad 132 may be further reduced, which may reduce the temperature of the region where the semiconductor wafer 124 and the polishing pad 132 contact each other. Thus, the amount of damage, i.e., change in the composition of the phase-change material may be reduced.

Figure 9A:
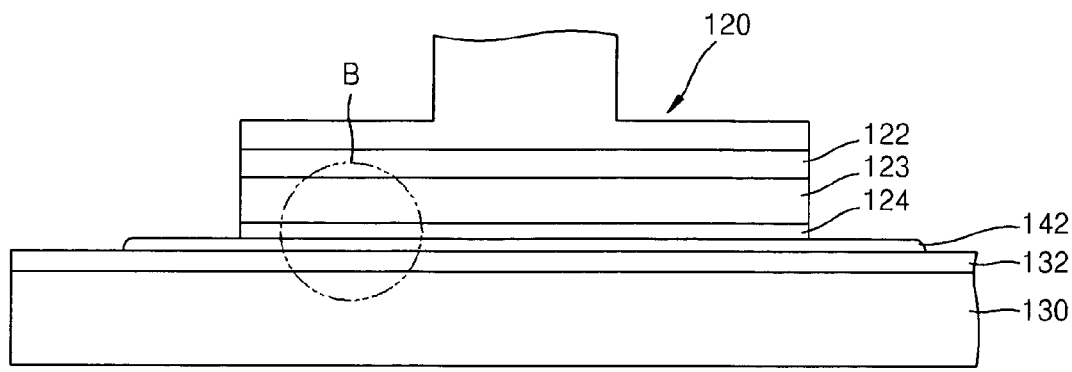
FIG. 9A illustrates a cross-sectional view of a polishing head used to perform a CMP process on a phase-change material according to an embodiment.
Figure 9B:
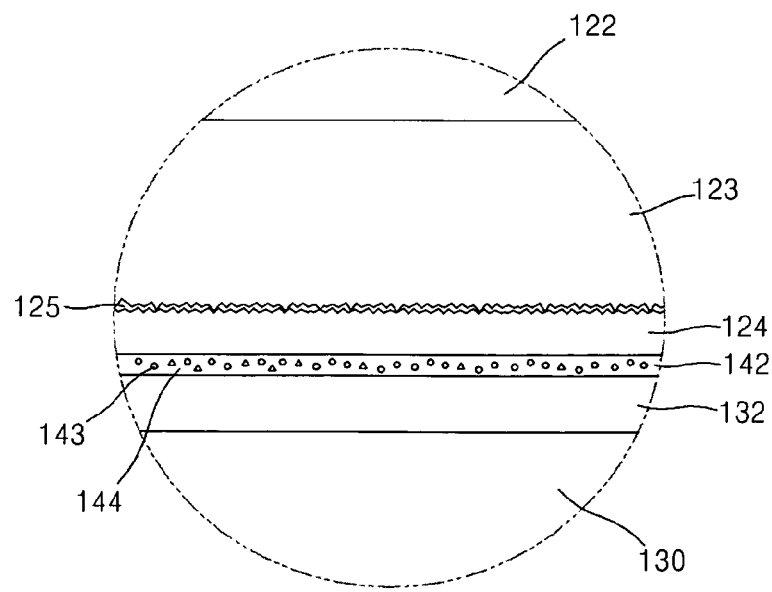
FIG. 9B illustrates an enlarged view of part B of the polishing head of FIG. 9A.

FIG. 9A illustrates a cross-sectional view of a polishing head 120 used to perform a CMP process on a phase-change material according to another embodiment. FIG. 9B illustrates an enlarged view of a part B of the polishing head 120 of FIG. 9A.

Referring to FIG. 9A, the polishing head 120 may be disposed on the platen 130. The semiconductor wafer 124 fixed to the polishing head 120 may be pressed and contact the polishing pad 132. The slurry 142 may be disposed between the polishing pad 132 and the semiconductor wafer 124.

The thickness of the semiconductor wafer 124 may be less than about 1 mm and the temperature of the semiconductor wafer 124 may exceed about 60° C. during the CMP process since the semiconductor wafer 124 that is covered by the backing film 122 formed of a thermal insulator may not externally dissipate heat.

In an implementation, a heat sink 123 may be disposed between the backing film 122 and the semiconductor wafer 124. That is, the polishing head 120 may fix the semiconductor wafer 124 and the heat sink 123 to the polishing pad 132. The heat sink 123 may include, e.g., a metal plate, a metal mesh, or a metal donut, formed of a metal material having a high heat transfer coefficient. The heat sink 123 may be cooled to a predetermined temperature before the CMP process is performed, may contact the semiconductor wafer 124, and may be fixed to the polishing head 120.

During the CMP process, the heat sink 123 may absorb heat generated by friction in the region where the semiconductor wafer 124 and the polishing pad 132 contacts each other through the semiconductor wafer 124, thereby preventing or minimizing an increase the temperature of the semiconductor wafer 124. The thickness of the heat sink 123 may vary according to the characteristics of a material of the heat sink 123, e.g., specific heat or heat transfer coefficient.

Although the semiconductor wafer 124 and the heat sink 123 contact each other in FIG. 9A, since the semiconductor wafer 124 and the heat sink 123 may not have planar surfaces, as illustrated in FIG. 9B, the semiconductor wafer 124 and the heat sink 123 may only partially contact each other; and a region where the semiconductor wafer 124 and the heat sink 123 do not contact each other may be filled with air. Air having a low heat transfer coefficient may not transfer heat smoothly. Accordingly, a heat transfer medium material 125 may be disposed between the semiconductor wafer 124 and the heat sink 123. For example, the heat transfer medium material 125 may include, e.g., a thermal grease, a material having a higher heat transfer coefficient than the semiconductor wafer 124, e.g., a material having a heat transfer coefficient exceeding about 1.5 W/(m·K).

The slurry 142 may include slurry powder 143 and slurry liquid 144. In an implementation, the slurry powder 143 may contain material particles having a high heat transfer coefficient, low chemical reactivity, and a large intensity, e.g., diamond particles or carbon nanotube particles. The slurry 142 containing, e.g., diamond particles or carbon nanotube particles, having a high heat transfer coefficient may externally dissipate heat in the region where the semiconductor wafer 124 and the polishing pad 132 contact each other, thereby reducing the temperature of the region.

Figure 10A:
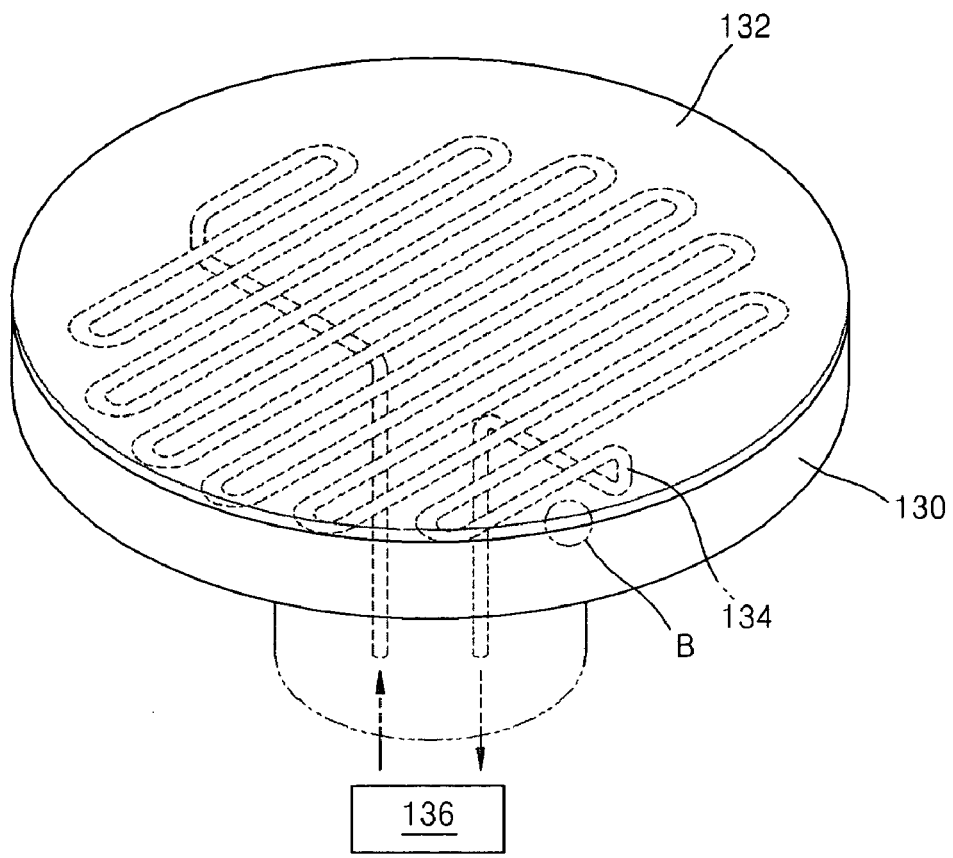
FIG. 10A illustrates a transparent perspective view of a platen including a cooling unit having a cooling pump and a conduit according to an embodiment.
Figure 10B:
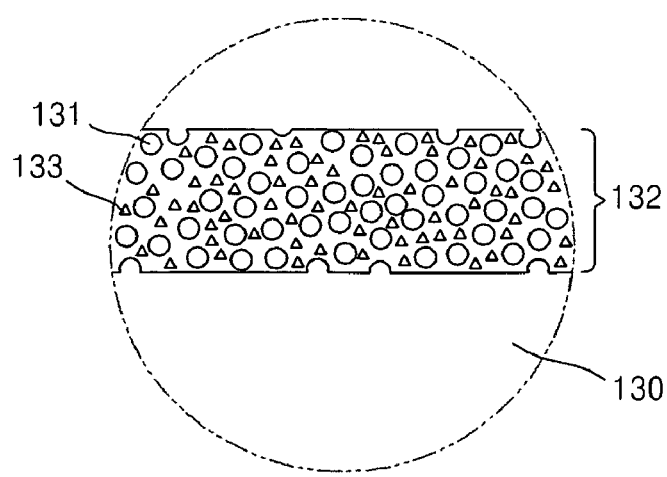
FIG. 10B illustrates an enlarged view of part B of the platen of FIG. 10A.

FIGS. 10A and 10B schematically illustrate the platen 130 according to an embodiment. FIG. 10A illustrates a transparent perspective view of the platen 130 including a cooling unit having a cooling pump 136 and a conduit 134. FIG. 10B illustrates an enlarged view of a part B of the platen 130.

Referring to FIG. 10A, the platen 130 may support the polishing pad 132 and may rotate in a predetermined direction during a CMP process. The platen 130 may include a cooling unit. The cooling unit may include the conduit 134 in which a heat transfer medium, e.g., cooling water, flows and the cooling pump 136 that smoothly circulates the heat transfer medium through the conduit 134.

The conduit 134 may be disposed throughout the platen 130 uniformly in order to cool the platen 130. The conduit 134 may have, e.g., a spiral shape, in addition to the shape shown.

The polishing pad 132 may be formed of a thermal insulator, e.g., porous polyurethane, and may include a plurality of pores 131 as illustrated in FIG. 10B. The polishing pad 132 may include heat transfer materials 133 so as to adjust the temperature of the region where the semiconductor wafer 124 and the polishing pad 132 contact each other through the platen 130 cooled to and maintained at a low temperature by the cooling unit. The heat transfer materials 133 may include, e.g., diamond particles or carbon nanotube particles, which may be used in the slurry 142. The diamond particles or carbon nanotube particles may be hard, may have a high heat transfer coefficient, and may be chemically stable.

The heat transfer materials 133 may be included in the polishing pad 132 and thus a heat transfer path that penetrates the polishing pad 132 may be formed. Heat generated in the region where the semiconductor wafer 124 and the polishing pad 132 contact each other may be dissipated to the platen 130, having a relatively low temperature, through the heat transfer path.

The platen 130 may be cooled to a low temperature by the cooling unit, and the heat transfer materials 133 may be included in the polishing pad 132 and, thus, the heat transfer path may be formed, thereby easily externally dissipating frictional heat generated in the polishing pad 132. Thus, damage to the phase-change material may be beneficially reduced.

Figure 11A:
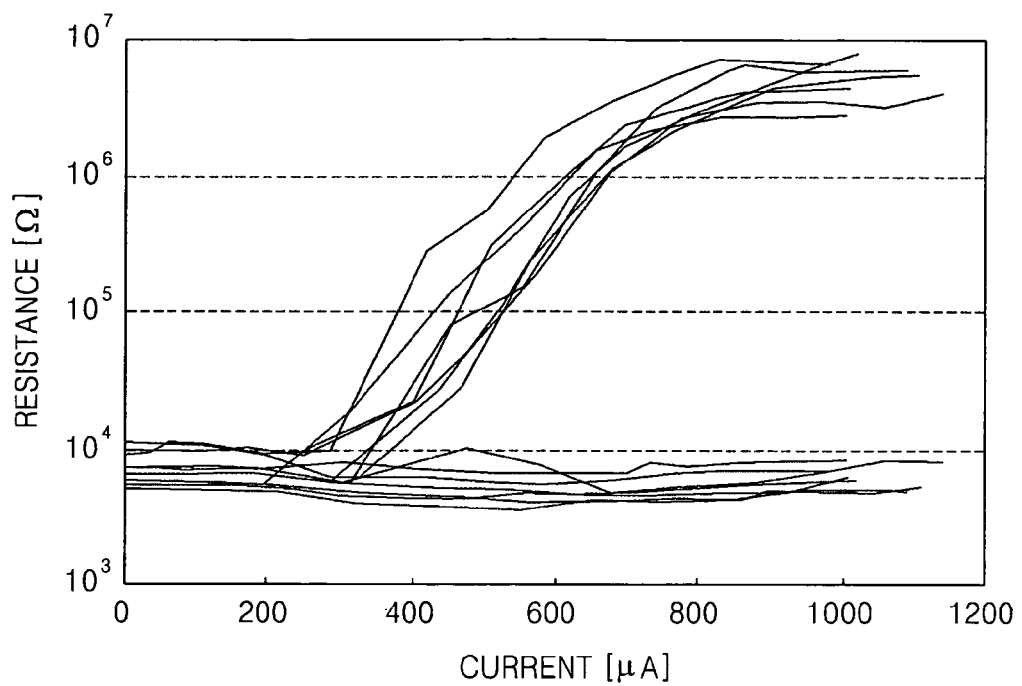
FIGS. 11A through 11C illustrate graphs of current and resistance characteristics of a phase-change material on which a CMP process is performed by adjusting the temperature of a polishing pad according to an embodiment.
Figure 11B:
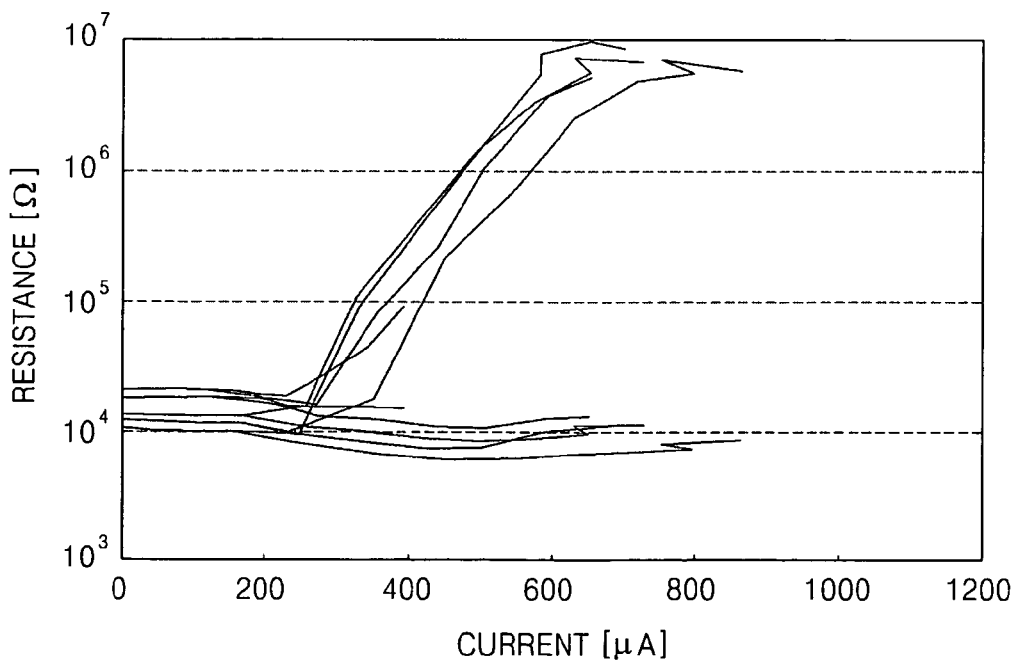
Figure 11C:
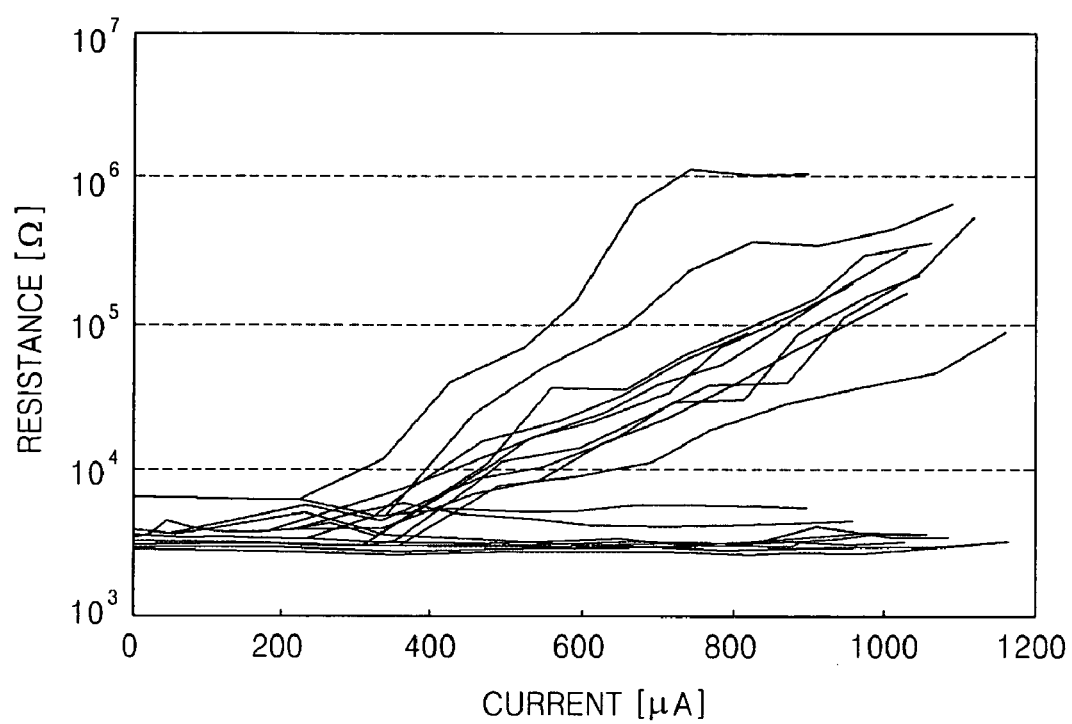

FIGS. 11A through 11C illustrate graphs of resistance characteristics with regard to current based on adjusted temperature of a polishing pad during a CMP process according to an embodiment.

FIG. 11A illustrates a graph of resistance characteristics with regard to current of a GST alloy phase-change material, on which the CMP process was performed at a polishing pad temperature of 30° C. (hereinafter, "low temperature CMP method"). The temperature of the polishing pad was reduced by providing the slurry at 10° C.

FIG. 11B illustrates a graph of resistance characteristics with regard to current of the GST alloy phase-change material, on which the CMP process was performed at a polishing pad temperature of 41° C. (hereinafter, "medium temperature CMP method"). The slurry was provided at 26° C.

FIG. 11C illustrates a graph of resistance characteristics with regard to current of the GST alloy phase-change material, on which the CMP process was performed at a polishing pad temperature of 53° C. (hereinafter, "high temperature CMP method"). The temperature of the polishing pad was increased by providing the slurry at 51° C.

Referring to FIGS. 11A through 11C, the phase-change material (illustrated in FIG. 11C) polished using a high temperature CMP method may not have stable set and reset characteristics compared to the phase-change materials (illustrated in FIGS. 11A and 11B) polished using low and medium temperature CMP methods, respectively. The phase-change material polished using the high temperature CMP method may have a relatively higher reset current $I_{reset}$ than the phase-change materials polished using low and medium temperature CMP methods. Although not shown, the reset current $I_{reset}$ of the phase-change materials polished using low and medium temperature CMP methods may be about 0.6 mA, whereas the reset current $I_{reset}$ of the phase-change material polished using the high temperature CMP method may be about 1.2 mA.

Referring to FIGS. 11A to 11C, the phase-change material polished using the low temperature CMP method may have stable current and resistance characteristics compared to the phase-change material polished using the medium temperature CMP method. Furthermore, the phase-change material polished using the medium temperature CMP method may have a ratio of about 450:1 of set resistance to reset resistance, whereas the phase-change material polished using the low temperature CMP method may have a ratio of about 800:1 of the set resistance and the reset resistance. The higher ratio of set resistance to reset resistance may be easier for sensing. The phase-change material polished using the high temperature CMP method may have a ratio of about 100:1 of the set resistance and the reset resistance.

A small thickness of a damaged portion of the phase-change material makes it possible to have more stable characteristics and easier sensing. The small thickness of the damaged portion of the phase-change material may be shown according to an experiment described below.

Figure 12A:
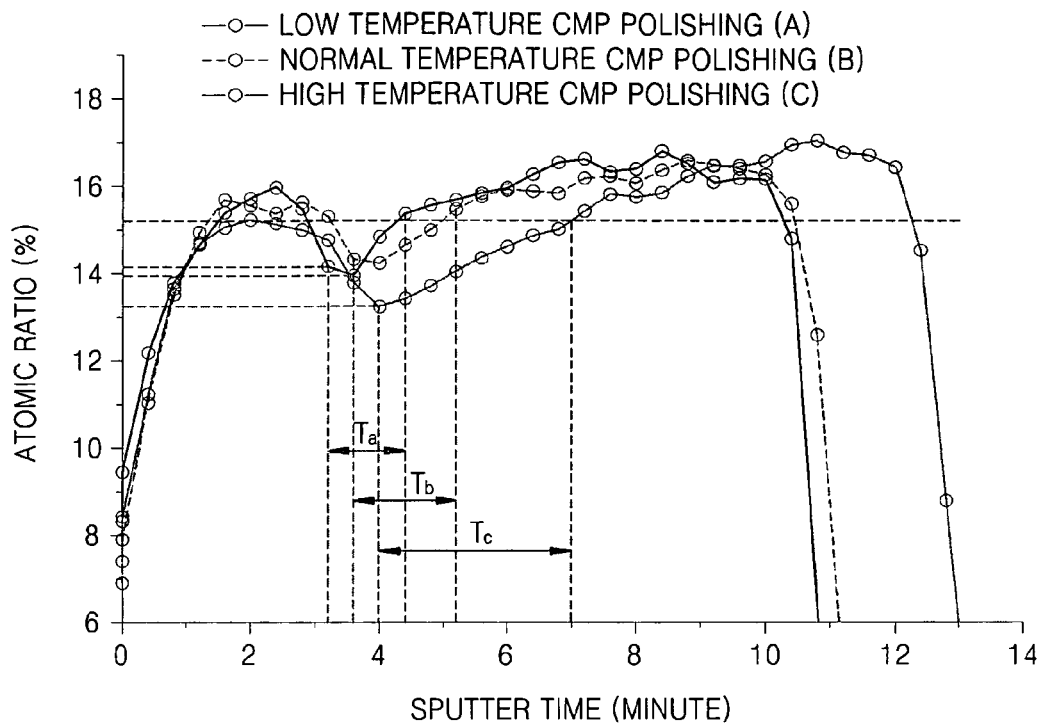
FIGS. 12A and 12B illustrate graphs of profiles of germanium and tellurium content of the phase-change materials shown in FIGS. 11A through 11C according to an embodiment.
Figure 12B:
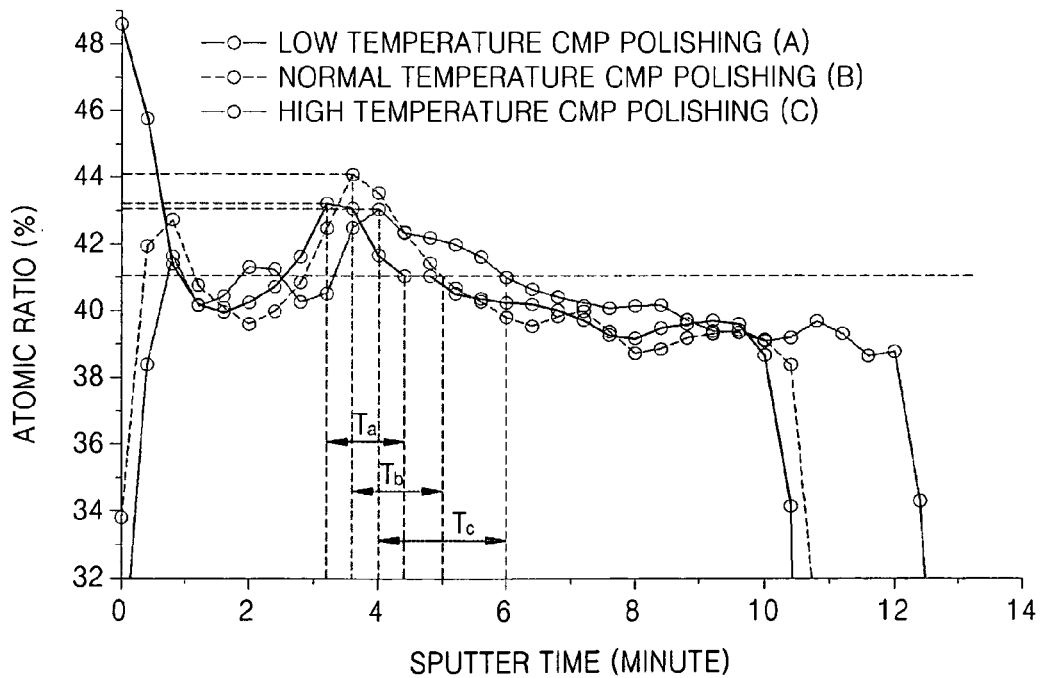

FIGS. 12A and 12B illustrate graphs of profiles of germanium (Ge) and tellurium (Te) of the phase-change materials polished using the low, medium, and high temperature CMP methods illustrated in FIGS. 11A through 11C according to an embodiment. The graphs show atomic ratio with regard to sputter time. The phase-change materials may be etched by sputtering so that the sputter time may be in proportion to the depth of the phase-change materials. Thus, the graphs show the atomic ratio with regard to depth of the phase-change materials.

A CMP process was performed on a GST alloy having a thickness of about 200 nm at low, medium, and high temperatures. Then, another GST alloy layer having a thickness of about 50 nm was deposited thereon.

Referring to FIG. 12A, the bold solid line indicates the phase-change material "a" polished using the low temperature CMP method. The dotted line indicates the phase-change material "b" polished using the medium temperature CMP method. The thin solid line indicates the phase-change material "c" polished using the high temperature CMP method.

Since the initial sputter time of about 1 to 3 minutes indicates the atomic ratio of the additionally formed GST alloy layer, all the phase-change materials a, b, and c were similar to each other. Thereafter, the ratio of Ge of all the phase-change materials a, b, and c was reduced. Since the additionally formed GST alloy layer of all the phase-change materials a, b, and c had different thicknesses, the reduction of the ratio of Ge of all the phase-change materials a, b, and c occurred at different times.

After about 5 minutes of the phase-change materials "a" and about 7 minutes of the phase-change materials "c," the atomic ratio of Ge of the initially formed GST alloy layer were similar to each other.

When a reference rate is about 15.2% in an axis of y, since Ge content was reduced at a part having a smaller ratio than the reference rate, the part is regarded as being damaged. The phase-change material "a" had about 0.9 minutes of damaged time Ta. The phase-change material "b" had about 1.2 minutes of damaged time Tb. The phase-change material "c" had about 2.35 minutes of damaged time Tc. Thus, the ratio of Ge of the phase-change material "c" was remarkably reduced.

Since the damaged time Ta, Tb, and Tc were in proportion to depths of the damaged phase-change materials, the damaged portion of the phase-change material "a" polished using the low temperature CMP method had a small thickness. Thus, as illustrated in FIGS. 11A and 11B, there were differences in the stable characteristics and easier sensing among the phase-change materials polished using the low, medium, and high temperature CMP methods.

FIG. 12B illustrates a graph of the atomic ratio of Te with regard to the sputter time, which is in proportion to the depths of the phase-change materials. The graph shows a ratio of thickness of each damaged phase-change material. When a reference rate was about 41.1%, the phase-change material "a" had about 0.8 minutes of damaged time Ta. The phase-change material "b" had about 1.05 minutes of damaged time Tb. The phase-change material "c" had about 1.5 minutes of damaged time Tc. Thus, the damaged portion of the phase-change material "a" generated by using the low temperature CMP method had the smallest thickness.

The numerical values illustrated in FIGS. 11A through 12B were obtained from an experiment regarding the characteristics of the phase-change materials on which the CMP is performed according to the present embodiment, and may vary according to other structures used in the experiment. Therefore, the embodiments are not limited to the numerical values or the graphs illustrated in FIGS. 11A through 12B.

Various embodiments may be used independently or in combination in order to reduce damage to a phase-change material, i.e. a change in the composition of the phase-change material.

Although a method of fabricating a PRAM is described in the embodiments, the embodiments may be applied to a method of fabricating a resistance memory that uses a phase-change material requiring a CMP process.

The CMP process according to embodiments described above overcomes drawbacks of other CMP processes. With respect to the such processes, phase-change material may be more ductile than a metal material and may be highly reactive to water. Such ductility and reactivity of the phase-change material may make it difficult to form a fine electrode by using a conventional patterning technology. Furthermore, electrodes formed of the phase-change material may be close to each other, which may cause a malfunction, making it difficult to use the PRAM. The CMP process according to embodiments, however, may provide improved electrodes of a phase-change material, as damage therein may be decreased.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A chemical-mechanical polishing (CMP) method of polishing a phase-change material, the method comprising:

forming the phase-change material on an activation surface of a semiconductor wafer; and performing a CMP process on the phase-change material using a polishing pad, wherein performing the CMP process includes reducing a change in the composition of the phase-change material by adjusting, within a predetermined range, a temperature of a region where the semiconductor wafer and the polishing pad contact each other.

2. The method as claimed in claim 1, wherein the predetermined range is about 10° C. to about 30° C.

3. The method as claimed in claim 1, wherein performing the CMP process includes cooling and supplying slurry.

4. The method as claimed in claim 3, wherein the slurry is cooled to a temperature of about 5° C. to about 20° C.

5. The method as claimed in claim 3, wherein a polishing head fixes the semiconductor wafer to the region where the semiconductor wafer and the polishing pad contact each other and the slurry is supplied by a slurry dispenser that is disposed at a circumference of the polishing head.

6. The method as claimed in claim 1, wherein the CMP process is performed in a polishing chamber, the polishing chamber including a sheath formed of a thermal insulator and a cooling device for cooling the interior of the polishing chamber in order to adjust the temperature of the region where the semiconductor wafer and the polishing pad contact each other within the predetermined range.

7. The method as claimed in claim 1, wherein the CMP process is performed in a CMP polishing device, the CMP polishing device including a pad conditioner for discharging a cooling gas toward the polishing pad in order to adjust the temperature of the region where the semiconductor wafer and the polishing pad contact each other within the predetermined range.

8. The method as claimed in claim 1, wherein the semiconductor wafer is fixed to a polishing head, the polishing head including a heat sink that contacts a surface of the semiconductor wafer opposite to the activation surface.

9. The method as claimed in claim 1, wherein the phase-change material includes at least one of germanium (Ge), antimony (Sb), tellurium (Te), indium (In), or a chalcogenide alloy containing mixtures thereof.

10. A method of fabricating a phase-change memory, the method comprising:

forming the phase-change material on an activation surface of a semiconductor wafer;

performing a CMP process on the phase-change material using a polishing pad; and forming a memory device from the phase-change material, wherein the performing the CMP process includes reducing a change in the composition of the phase-change material by adjusting, within a predetermined range, a temperature of a region where the semiconductor wafer and the polishing pad contact each other.

11. The method as claimed in claim 10, wherein the predetermined range is about 10° C. to about 30° C.

12. The method as claimed in claim 10, wherein the CMP process includes cooling and supplying slurry.

13. The method as claimed in claim 12, wherein the slurry is cooled to a temperature of about 5° C. to about 20° C.

14. The method as claimed in claim 12, wherein a polishing head fixes the semiconductor wafer to the region where the semiconductor wafer and the polishing pad contact each other and the slurry is supplied by a slurry dispenser that is disposed at a circumference of the polishing head.

15. The method as claimed in claim 10, wherein the CMP process is performed in a polishing chamber, the polishing chamber including a sheath formed of a thermal insulator and a cooling device for cooling the interior of the polishing chamber in order to adjust the temperature of the region where the semiconductor wafer and the polishing pad contact each other within the predetermined range.

16. The method as claimed in claim 10, wherein the CMP process is performed in a CMP polishing device, the CMP polishing device including a pad conditioner for discharging a cooling gas toward the polishing pad in order to adjust the temperature of the region where the semiconductor wafer and the polishing pad contact each other within the predetermined range.

17. The method as claimed in claim 10, wherein the semiconductor wafer is fixed to a polishing head, the polishing head including a heat sink that contacts a surface of the semiconductor wafer opposite to the activation surface.

18. The method as claimed in claim 10, wherein the phase-change material includes at least one of germanium (Ge), antimony (Sb), tellurium (Te), indium (In), or a chalcogenide alloy containing mixtures thereof.

* * * * *